United States Patent
Kwon

(10) Patent No.: US 7,005,320 B2
(45) Date of Patent: Feb. 28, 2006

(54) METHOD FOR MANUFACTURING FLIP CHIP PACKAGE DEVICES WITH A HEAT SPREADER

(75) Inventor: Heung Kyu Kwon, Sungnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/165,736

(22) Filed: Jun. 7, 2002

(65) Prior Publication Data

US 2003/0047814 A1 Mar. 13, 2003

(30) Foreign Application Priority Data

Sep. 10, 2001 (KR) ............... 2001-55454

(51) Int. Cl.
*H01L 21/58* (2006.01)
(52) U.S. Cl. .............. 438/108; 438/122; 438/124; 438/612; 438/613; 438/614
(58) Field of Classification Search ............... 438/108, 438/122, 124, 127, 612, 613, 614
See application file for complete search history.

(56) References Cited

U.S. PATENT DOCUMENTS

| | | | | |
|---|---|---|---|---|
| 3,651,562 A | * | 3/1972 | Hambleton | 438/122 |
| 5,128,746 A | * | 7/1992 | Pennisi et al. | 257/738 |
| 5,477,082 A | * | 12/1995 | Buckley et al. | 257/679 |
| 5,528,462 A | * | 6/1996 | Pendse | 361/767 |
| 5,583,073 A | * | 12/1996 | Lin et al. | 438/614 |
| 5,744,869 A | | 4/1998 | Root | 257/778 |
| 5,770,891 A | * | 6/1998 | Frankeny et al. | 257/727 |
| 5,785,799 A | | 7/1998 | Culnane et al. | 156/379.7 |
| 5,835,355 A | * | 11/1998 | Dordi | 361/760 |
| 6,118,177 A | | 9/2000 | Lischner et al. | 257/706 |
| 6,121,070 A | * | 9/2000 | Akram | 438/108 |
| 6,126,428 A | * | 10/2000 | Mitchell et al. | 425/110 |
| 6,194,788 B1 | * | 2/2001 | Gilleo et al. | 257/789 |
| 6,229,831 B1 | * | 5/2001 | Nightingale et al. | 372/36 |
| 6,486,562 B1 | * | 11/2002 | Kato | 257/778 |
| 6,615,484 B1 | * | 9/2003 | Kirsten | 29/841 |
| 2002/0175403 A1 | * | 11/2002 | Sreeram et al. | 257/702 |

\* cited by examiner

*Primary Examiner*—Stephen W. Smoot
(74) *Attorney, Agent, or Firm*—Harness, Dickey & Pierce

(57) ABSTRACT

A method for manufacturing a flip chip package includes preparing an IC chip that includes an active surface on which electrode pads are formed, attaching a heat dissipater to a backside of the IC chip with a thermal interface material (TIM), providing a flux filler layer on a substrate, where the substrate includes a plurality of land pads each corresponding to each of the plurality of electrode pads, and mounting the IC chip to the substrate with the active surface facing the substrate. The method further includes forming metal connectors on each of the corresponding plurality of electrode pads of the IC chip, and forming an electrical interconnection between the land pads of the substrate and the plurality of metal connectors by soldering the metal connectors to the land pads. The heat dissipator may be a hermetic heat spreader having a pair of opposite ends bent toward the substrate, which are hermetically sealed to the substrate.

31 Claims, 5 Drawing Sheets

METHOD FOR MANUFACTURING FLIP CHIP PACKAGE DEVICES WITH A HEAT SPREADER

BACKGROUND OF THE INVENTION

1. Field of the Invention

This invention relates to packaging of semiconductor integrated circuit (IC) chips, and more particularly to a method for manufacturing flip chip package devices to improve the heat dissipation of the package.

2. Description of the Related Art

Flip chip technology provides a method for connecting an IC device to a substrate (e.g., a printed circuit board). To provide a flip chip package, a number of round or hemispherical solder connectors are formed on corresponding electrode pads which reside on the active surface of an IC device. Next, with the active surface facing the substrate, the IC device is mounted on the substrate by reflow-bonding the solder connectors of the IC chip to terminal pads formed on the substrate. During the bonding, heat is applied to reflow the solder connectors in order to form an electrical and mechanical connection between the substrate and the active surface of the IC device. Since the flip chip package does not employ bonding wires, the length of the electrical connection is shorter, and the dimension of the package can be reduced to as small as the chip size.

However, thermal problems do exist with the flip chip package. This is due mainly to thermal coefficient of expansion (TCE) mismatch between the IC device and the substrate. Particularly, in high power IC chips, such as a high-speed CPU chip, a design to effectively dissipate heat generated by the IC device is of great importance. Generally, to compensate for the heat, the high power flip chip device includes a heat spreader or a heat sink attached to the backside (non-active surface) of the IC chip via a Thermal Interface Material (TIM).

These conventional flip chip devices are assembled or packaged by the following process. Solder connectors are formed on the electrode pads which reside on the active surface of an IC chip. A substrate having conductive pads corresponding to the electrode pads is prepared. Next, the IC chip is connected to the substrate by connecting the solder connectors of the IC chip to the pads on the substrate and reflow-soldering the solder connectors. Before the reflow, a flux may be transferred to the solder connectors by using a dipping technique or dispensing technique. The flux may also be applied to the pads on the substrate before the reflow. A conventional underfill is then applied to fill the space between the active surface of the IC chip and the substrate using capillary force. Following this, a solder TIM is applied or attached to the backside of the IC chip and a heat spreader is connected to the IC chip.

The connection temperature of the heat spreader depends on the composition of the solder TIM. When the solder TIM comprises both of solder and flux, the connection temperature is lower, while the temperature increases for a solder TIM having only solder. Conventionally, the temperature for connecting the heat spreader to an IC chip ranges from about 280° C. to 340° C.

If the connecting temperature is high, the property of the underfill material bonding the IC chip to the substrate is degraded and the reliability of the substrate is decreased. Conventional organic substrates such as printed circuit boards suffer degradation at temperature above 250° C. When the connecting temperatures is lower however, a void may form at the interface of the solder TIM with the heat spreader. This results in the degradation of the heat dissipation.

Moreover, when the heat spreader is attached to the IC chip and is hermetically bonded to the substrate, a void may form in the hermetic sealant, which leads to failure during a reliability test such as PCT (Pressure Cooker Test) performed under a hot and humid environment (since the void provides a path along which water can penetrate).

SUMMARY OF THE INVENTION

According to one aspect of the present invention, a method for manufacturing a flip chip package includes preparing an IC chip that includes an active surface on which electrode pads are formed, attaching a heat dissipater to a backside of the IC chip with a thermal interface material (TIM), providing a flux filler layer on a substrate, where the substrate includes a plurality of land pads each corresponding to each of the plurality of electrode pads, and mounting the IC chip to the substrate with the active surface facing the substrate. The method further includes forming metal connectors on each of the corresponding plurality of electrode pads of the IC chip, and forming an electrical interconnection between the land pads of the substrate and the plurality of metal connectors by soldering the metal connectors to the land pads. The heat dissipater may be a hermetic heat spreader having a pair of opposite ends bent toward the substrate, which are hermetically sealed to the substrate.

According to another aspect of the present invention, a method for manufacturing a flip chip package is described which includes preparing a semiconductor IC chip having an active surface on which electrode pads are formed, attaching a heat dissipater to a backside of the IC chip with a thermal interface material (TIM), wherein the backside of the IC chip is opposite the active surface, mounting the IC chip to the substrate with the active surface facing the substrate, and forming an encapsulant body between the substrate and the IC chip and between the substrate and the heat dissipater.

These and other features, and advantages, will be more clearly understood from the following detailed description taken in conjunction with the accompanying drawings. It is important to point out that the illustrations may not necessarily be drawn to scale, and that there may be other embodiments of this invention which are not specifically illustrated.

DETAILED DESCRIPTION

Figure 1:
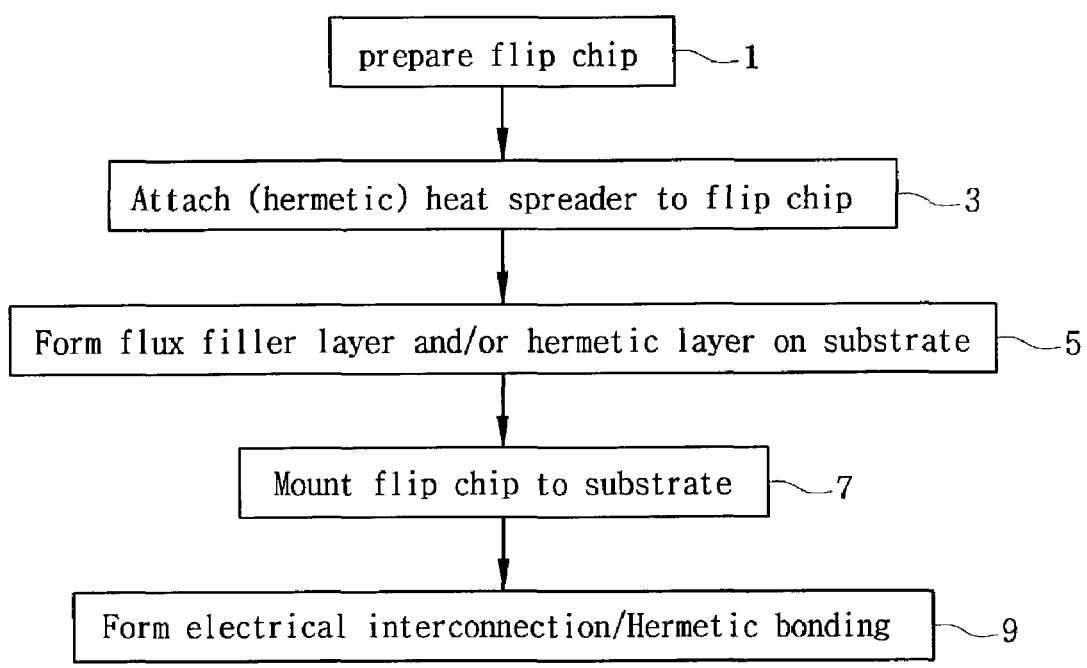
FIG. 1 is a flow diagram of the process for manufacturing flip chip package devices according to the present invention.

FIG. 1 is a flow diagram illustrating a process for manufacturing flip chip package devices according to an embodiment of the present invention. The process begins by preparing an IC chip in a flip chip package and forming metal connectors (e.g., solder balls) on electrode pads on an active surface of the IC chip (step 1). A heat dissipater (e.g., a heat spreader, a heat sink, or a hermetic heat dissipater) is then attached to the IC chip (step 3). The heat dissipater is attached to the IC chip by soldering a Thermal Interface Material (TIM) to the backside (i.e., the side opposing the active surface) of the IC chip and then placing the heat dissipater on the soldered TIM. The TIM is a thermally conductive and conforming material which, among other functions, helps guard against IC chip failure during environmental testing of the IC chip. If the heat dissipater and the IC chip are not properly attached via the TIM, the quality of the thermal interface between them may be degraded, possibly causing damage to the package device.

Following the placement of the heat dissipater on the IC chip, a flux filler layer is formed on a substrate, which receives the IC chip. Alternatively, a hermetic layer is formed on the substrate simultaneously with a flux filler layer (step 5). The flux filler layer is formed of a material that is able to function as both flux and underfill. The flip chip is mounted to the substrate with the flux filler layer and/or the hermetic layer (step 7), and an electrical interconnection is formed between the substrate and the IC chip. The hermetic layer fills the space between the heat dissipater and the substrate, and is made of material identical to or different from the flux filler layer. The heat dissipater is then hermetically bonded to the substrate during the formation of electrical interconnection, so that a hermetic environment is provided to the flip chip (step 9).

Figure 2:
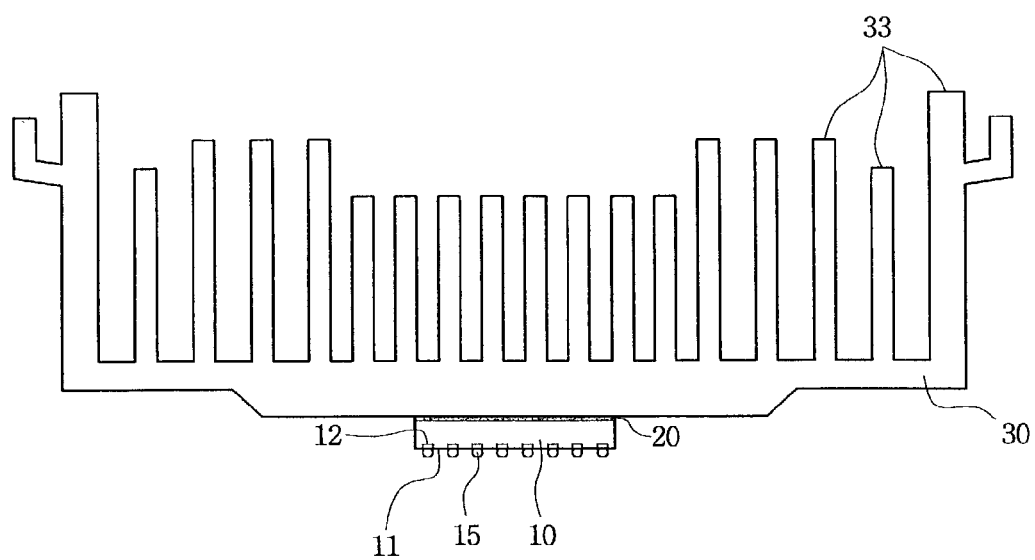
FIG. 2 is a cross-sectional view illustrating the process of attaching a heat dissipater to an IC chip according to a first embodiment of the present invention.

FIG. 2 is a cross-sectional view illustrating the attachment of a heat dissipater to an IC chip according to a first embodiment of the present invention.

An IC chip 10 includes an active surface 11, on which on-chip circuitry (not shown) and a plurality of electrode pads 12 are formed to electrically interconnect IC chip 10 to an external device (e.g., a circuit substrate). A passivation film (not shown) typically covers all areas of active surface 11 excluding electrode pads 12. Mounted on electrode pads 12 include a number of metal connectors 15. The metal connectors 15 may be spherical or hemispherical, or may be rectangular parallelepiped in shape. Metal connectors 15 may be made of, for example, tin-lead (Sn—Pb) alloy, lead alloy with silver (Ag) added, or gold (Au) or nickel (Ni) with silver added. Alternatively, lead-free solder alloy can be used for metal connector 15. Indium (In) or bismuth (Bi) can substitute silver (Ag) for the metal connector 15. A lead-free metal connector 15 is substantially made of tin (Sn), copper (Cu), Indium (In), antimony (Sb) or zinc (Zn).

On the backside (i.e., the side opposite active surface 11) of IC chip 10, a Thermal Interface Material (TIM) is formed. TIM 20 metalizes and provides protection to the backside of the IC chip 10 for subsequent soldering. TIM 20 may be made of, for example, a tin-lead alloy or tin-lead alloy with additives such as silver (Ag). The metalization is performed by depositing metal, for example, chromium (Cr), titanium (Ti), copper/nickel vanadium/Gold (Cu/VNi/Au) and silver (Ag), using a sputtering or evaporation method on IC chip (Ag). TIM 20 is deposited to the backside of IC chip 10 in the form of a sheet, for example, by a dispensing process.

A heat sink 30 is attached to TIM 20 on IC chip 10. Heat sink 30 is made of a thermally conductive material (e.g., of copper) which allows heat sink 30 to dissipate heat generated from IC chip 10. Although copper exhibits excellent thermal conductivity, other materials having effective thermal impedance and TCE may be used. These other materials include, for example, aluminum (Al), aluminum silicon carbide (AlSiC), tungsten copper (CuW) and diamond. Additionally, a surface treatment or an anodizing process using, for example, nickel (Ni), gold (Au), silver (Ag), tin (Sn) and palladium (Pd) can be applied to the surface of the heat dissipater 30.

To improve heat dissipation, it is useful to maximize the surface area of heat dissipater 30. This may be accomplished, for example, by forming a plurality of fins 33 as shown in FIG. 2 (however, a heat spreader having rectangular cross-section without any fins may also be used).

Heat sink 30 and IC chip 10 are coupled together by soldering TIM 20. Preferably, the soldering process employs solder preform or solder paste within a hydrogen ($H_2$) environment. In this embodiment, the $H_2$ soldering environment may either be vacuum or not.

Figure 3:
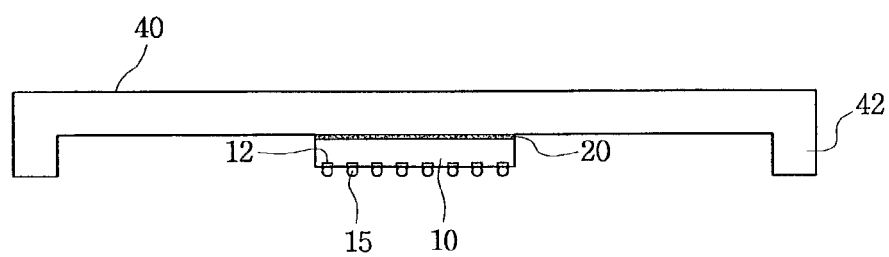
FIG. 3 is a cross-sectional view illustrating the process of attaching a hermetic heat spreader to an IC chip according to the present invention.

Turning now to FIG. 3, another embodiment of the present invention is shown to include a heat dissipater 40 attached to the backside of the IC chip 10. Heat dissipater 40 includes opposite ends that are bent toward IC chip 10 to form legs 42. Legs 42 are hermetically bonded to a substrate and detailed description thereof will be given with reference to the figures below.

Figure 4A:
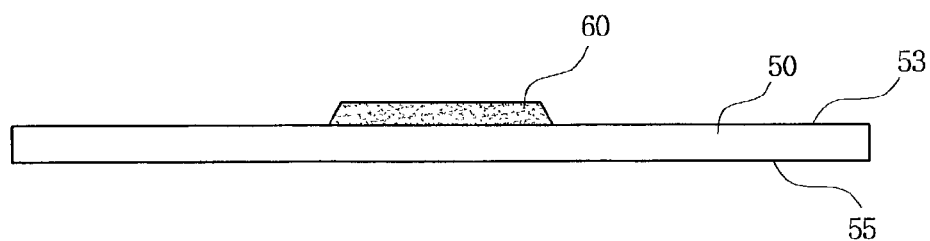
FIGS. 4a and 4b are cross-sectional views showing the process of forming a flux filler layer on a substrate.

Referring to FIG. 4a, a flux filler layer 60 is formed in a region where IC chip 10 is to be mounted on a substrate 50. Substrate 50 is preferably made of ceramic material and may be formed of conventional material for PCBs. Wiring patterns are formed on and/or within substrate 50 to provide multi-layer structures in and/or on substrate 50. Land pads (not shown) are formed on the surface of substrate 50 to provide connections for metal connectors 15 of IC chip 10. The land pads are formed by using sputtering to form three layers. The first layer is made of metal selected among copper (Cu), gold (Au), silver (Ag), and palladium (Pd). The second layer is made of metal selected among nickel (Ni) and copper (Cu). The third layer is made of metal selected among titanium tungsten (TiW), titanium (Ti), and nickel (Ni). The first layer is on the surface of substrate 50 to prevent the oxidation of the wiring patterns. The second layer on the first layer is for soldering. The third layer on the second layer is for adhesion and diffusion barrier. Further, it is preferable to deposit solder having a low melting point (e.g., less than 250° C.) before mounting the IC chip 10 on the land pads.

Flux filler layer 60 fills the space between active surface 11 of IC chip 10 and the top surface 53 of substrate 50 to protect IC chip 10 and substrate 50 from stresses applied during thermal cycling. Additionally, flux filler layer 60 protects metal connectors 15, and also absorbs and alleviates thermal stress due to the mismatch of TCEs of the IC chip 10 and substrate 50. Flux filler layer 60 may be formed by depositing, for example, liquid-state resin or sheet resin on the top surface 53 of substrate 50. The liquid-state resin or sheet resin should be capable of use as flux and underfill either with the stencil or dispensing method.

Figure 4B:
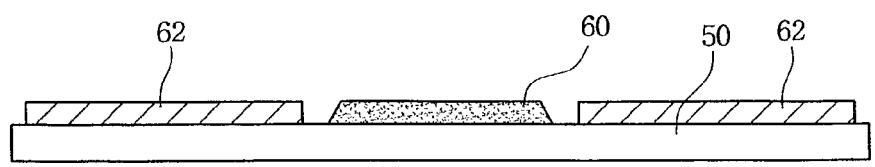

FIG. 4*b* illustrates the formation of a sealant layer 62 on the substrate 50 at the same time as the formation of flux filler layer 60. Sealant layer 62 may be formed of the same material as flux filler layer 62, however without flow, underfill, or resilient material (e.g., silicone rubber). Sealant layer 62 fills and seals the space between the substrate 50 and the heat dissipater 40, for example, space 65 shown in FIG. 6).

Turning now to the description of FIG. 5, an IC chip 10 is attached to heat sink 30 (as explained with reference to FIG. 2) and is also mounted to substrate 50 (as explained with reference to figures FIG. 4*a* and 4*b*). Substrate 50 includes flux filler layer 60 and/or a sealant layer 62 formed as described with reference to FIGS. 4*a* and 4*b*.

Figure 6:
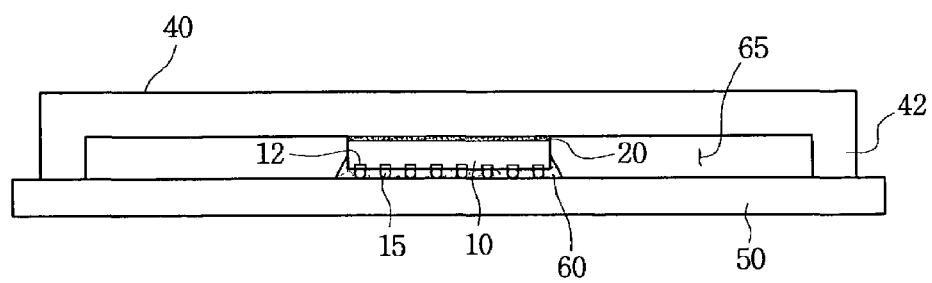
FIG. 6 is a cross-section view for illustrating the process of mounting an IC chip with a hermetic heat dissipater.

FIG. 6 illustrates an IC chip 10 with heat dissipater 40 attached to substrate 50, as described in figures FIG. 3 and FIG. 4*a*. As is shown, substrate 50 includes flux filler layer 60 formed as described in FIG. 4*a*.

Figure 5:
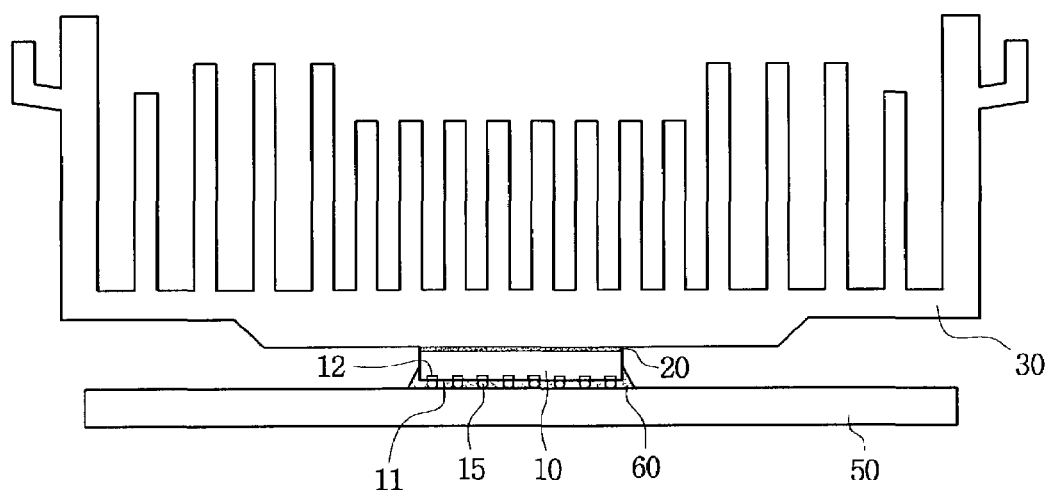
FIG. 5 is a cross-section view illustrating the process of mounting an IC chip with a heat dissipater.

Referring both to FIGS. 5 and 6, IC chip 10 is flip-mounted to substrate 50 so that metal connectors 15 contact the corresponding lands pads (not shown) of substrate 50. To help ensure a precise alignment, predetermined align keys (not shown) may be formed on the surface of substrate 50 at a given distance from the land pads. Electrical and mechanical interconnections (not shown) between IC chip 10 and substrate 50 are formed by aligning IC chip 10 and substrate 50, then reflowing metal connectors 15. The interconnections may be formed by, e.g., the Controlled Collapse Chip Connect (C4) process. Cleaning the interconnected structure to remove residual flux is optional. When the interconnections are formed near metal connectors 15, the underfill is hardened by reflow the hardening process.

Referring to FIG. 6 now, legs 42 of a heat dissipater 40 are hermetically bonded to top surface 53 of substrate 50 to provide a hermetic inside space 65 for the IC chip 10. Sealant for the hermetic bonding may be made of identical material to the flux filler layer 60 or other polymeric material such as soft silicone base sealant and hard epoxy base sealant.

Heat dissipater 40 provides a shielding structure protecting IC chip 10 from, for example, external EMI (Electro-Magnetic Interference). For enhancing this shielding effect, is possible to use electrically conductive sealant and form ground patterns on the top surface 53 of substrate 50 where legs 42 of the heat dissipater 40 are to be attached.

Figure 7:
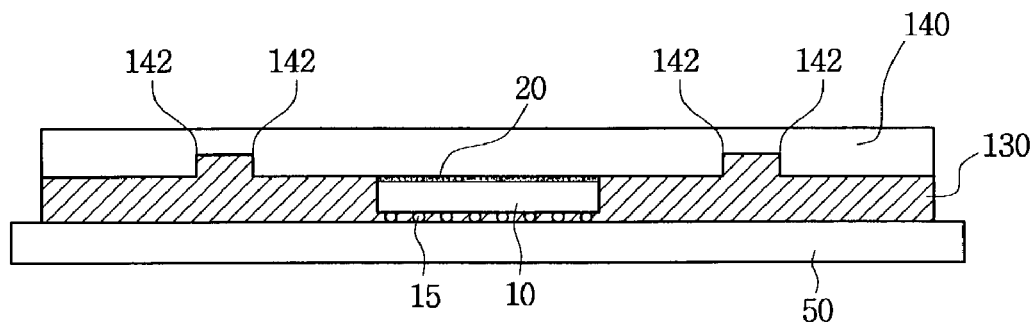
FIG. 7 is a cross-section view of a flip chip package manufactured according to an embodiment of the present invention.
Figure 8:
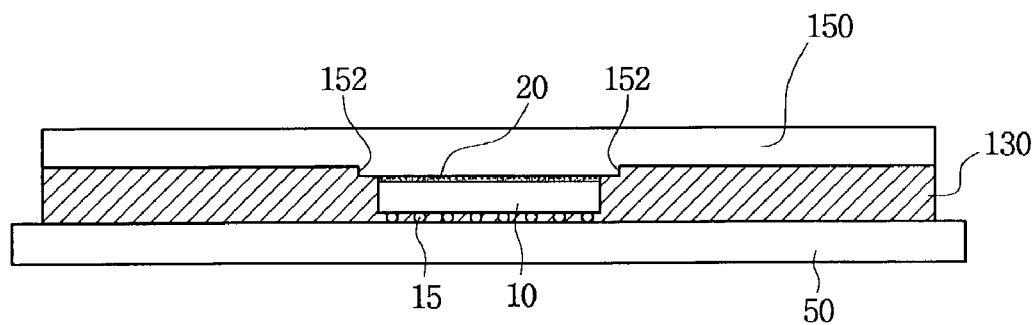
FIG. 8 is a cross-section view of a flip chip package manufactured according to another embodiment of the present invention.
Figure 9:
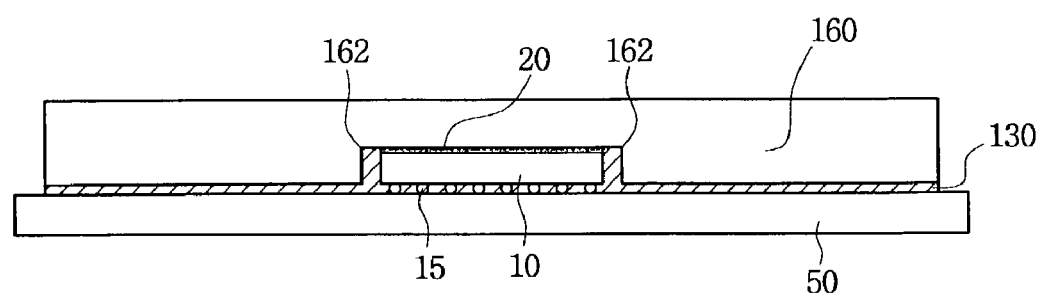
FIG. 9 is a cross-section view of a flip chip package manufactured according to yet another embodiment of the present invention.

Figures FIG. 7 to FIG. 9 are cross-sectional views of flip chip packages according to additional embodiments of the present invention.

In these additional embodiments, a number of metal connectors 15 are formed on electrode pads (not shown) on the active surface of IC chip 10 and heat dissipaters 140, 150 and 160 are attached to the backside of IC chip 10 via TIM 20, respectively. Identical or corresponding elements to the previous embodiments are denoted with the same reference numerals and a repeated explanation thereof will be omitted.

After flux is either applied to the surface of substrate 50 or applied to metal connectors 15, IC chip 10 is mounted to substrate 50. Next, a soldering process is performed to form an interconnection between IC chip 10 and the substrate 50.

Encapsulant body 130 is formed between substrate 50 and IC chip 10 and between substrate 50 and heat dissipaters 140, 150 and 160. Encapsulant body 130 is formed by using either a moldable underfill with the molding method or flowable underfill with the dispensing method. Flux filler layer 60 is not included. It is preferable to form angled portions 142, 152 and 162 in heat dissipaters 140, 150 and 160, respectively, to reinforce the coupling strength of encapsulant body 130.

Figure 10:
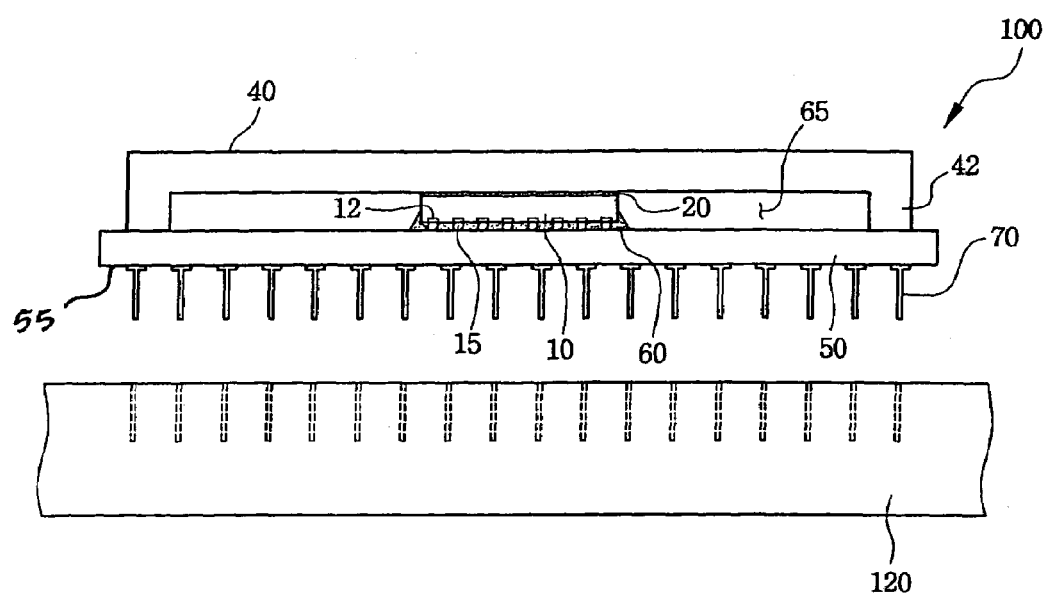
FIG. 10 is a cross-section view for showing a flip chip package produced according to another embodiment of the present invention.

FIG. 10 illustrates a flip chip package 100 manufactured in accordance with an embodiment of the present invention surface mounted to an external circuit board 120, e.g., a mother board of a computer system. Chip package 100 is connected to circuit board 120 with connection pins 70 arranged on the bottom surface 55 of a substrate 50. Connection pins 70 can be substituted by solder balls or land pads.

According to embodiments of the present invention, degradation of layer 60 can be prevented by performing flip chip mounting and the underfilling processes simultaneously after mounting a heat dissipater to the chip. Further, the structure manufactured according to the present invention exhibits improved heat dissipation property since the performance of solder interface between the chip and the substrate is enhanced.

In the drawings and specification, there have been disclosed typical preferred embodiments of this invention and, although specific terms are employed, they are used in a generic and descriptive sense only and not for purposes of limitation, the scope of this invention being set forth in the following claims.

What is claimed is:

1. A method for manufacturing a flip chip package, comprising:
   preparing a semiconductor IC chip having an active surface and a backside surface;
   forming a thermal interface material on the backside surface;
   attaching a heat dissipater to a backside of the semiconductor IC chip by soldering the thermal interface material;
   providing an underfill layer on a substrate, the underfill layer having a flux function; and
   mounting the active side of the semiconductor IC chip to the substrate, wherein the mounting of the active side is performed after attaching the heat dissipater and providing the underfill layer on the substrate.

2. The method of claim 1, wherein:
   the semiconductor IC chip includes:
      a plurality of electrode pads mounted on the active surface, and
      a metal connector mounted on each electrode pad of the plurality of electrode pads; and
   the substrate includes a plurality of land pads corresponding to each electrode pad of the plurality of electrode pads.

3. The method of claim 2, further comprising:
   providing an electrical connection between the plurality of land pads and the plurality of metal connectors by soldering the metal connectors to the plurality of land pads.

4. The method of claim 3, wherein the land pads are formed by using sputtering to form three layers, wherein a first layer is made of metal selected among copper, gold, silver, and palladium, a second layer is made of metal selected among nickel and copper, and a third layer is made of metal selected among titanium tungsten, titanium, and nickel.

5. The method of claim 3, further comprising:
   providing a solder to the land pads prior to the providing the underfill layer, wherein the solder has a low melting point.

6. The method of claim 2, wherein the metal connectors are formed from a material selected from a group consisting of tin-lead alloy, gold with silver added, tin-lead alloy with silver added, and nickel with gold added.

7. The method of claim 1 wherein the attaching the heat dissipater to the backside of the semiconductor IC chip using the thermal interface material comprises soldering the thermal interface material in a hydrogen environment.

8. The method of claim 1, further comprising:
forming a metal layer on a backside of the semiconductor IC chip prior to the attaching of the heat dissipater, wherein the metal layer is a material selected from a group consisting of chromium, titanium, copper/nickel, vanadium/gold, and silver.

9. The method of claim 1, wherein the thermal interface material is provided on the backside of the semiconductor IC chip in sheet form.

10. The method of claim 1, wherein the thermal interface material is made of a tin-lead alloy or a tin-lead alloy with silver added.

11. The method of claim 1, wherein the heat dissipater is made from a material selected from a group consisting of copper, aluminum, aluminum silicon carbide, tungsten copper, and diamond.

12. The method of claim 1, wherein the heat dissipater has a rectangular cross sectional shape.

13. The method of claim 1, wherein the underfill layer is formed by depositing liquid state resin or plate state resin on the substrate using the stencil or dispensing process.

14. The method of claim 1, wherein mounting the semiconductor IC chip comprises aligning the semiconductor chip with an align key formed on the substrate.

15. The method of claim 1, wherein the providing the underfill layer forms the underfill layer in a sealant.

16. The method of claim 15, wherein the sealant is made from a resilient material, a non-flowable underfill material, or the underfill material.

17. The method of claim 16, wherein the resilient material is silicone rubber.

18. The method of claim 1, further comprising: providing connection pins on said substrate.

19. The method of claim 1, further comprising: forming at least one angled portion in the heat dissipater.

20. A method for manufacturing a flip chip package, comprising:
preparing a semiconductor IC chip having an active surface and a backside surface;
applying a thermal interface material to the backside surface;
attaching a heat dissipater to a backside of the semiconductor IC chip by soldering the thermal interface material;
applying a flux to a substrate surface;
mounting the active side of the semiconductor IC chip to the substrate after applying the flux to the substrate surface; and
forming an encapsulant body between the substrate and the semiconductor IC chip and between the heat dissipater and the substrate, wherein the forming the encapsulant body is performed after the attaching the heat dissipater.

21. The method of claim 20, wherein:
the semiconductor IC chip includes:
a plurality of metal connectors;
a plurality of electrode pads mounted on the active surface, where a metal connector of said plurality of metal connectors, is mounted on each electrode pad of the plurality of electrode pads; and
the substrate includes a plurality of land pads corresponding to each electrode pad of the plurality of electrode pads.

22. The method of claim 21, further comprising:
providing an electrical connection between the plurality of land pads and the plurality of metal connectors by soldering the metal connectors to the plurality of land pads.

23. The method of claim 22, wherein, the flux is applied prior to the providing the electrical connection.

24. The method of claim 20, wherein the encapsulant body is formed via a moldable underfill and molding process.

25. The method of claim 20, wherein the encapsulant body is formed via a flowable underfill and dispensing process.

26. The method of claim 20, wherein the heat dissipater includes an angled portion to improve the coupling strength with the encapsulant body.

27. The method of claim 20, further comprising: forming at least one angled portion in the heat dissipater.

28. A method for manufacturing a flip chip package, comprising:
preparing a semiconductor IC chip having an active surface and a backside surface, the semiconductor IC chip having a plurality of electrode pads mounted on the active surface, and a metal connector mounted on each electrode pad of the plurality of electrode pads;
forming a thermal interface material on the backside surface;
attaching a heat dissipater to a backside of the semiconductor IC chip by soldering the thermal interface material;
providing an underfill layer on a substrate, the substrate including a plurality of land pads corresponding to each electrode pad of the plurality of electrode pads and the underfill layer having a flux function; and
mounting the active side of the semiconductor IC chip to the substrate by forming an electrical connection between the plurality of land pads and the plurality of metal connectors by soldering the metal connectors to the plurality of land pads,
wherein the mounting of the active side is performed after attaching the heat dissipater and providing the underfill layer on the substrate, the heat dissipater including legs facing the substrate, and providing the electrical connection includes hermetically sealing the legs to the substrate.

29. The method of claim 28, wherein a soft silicone base sealant or hard epoxy base sealant is used in sealing the legs to the substrate.

30. The method of claim 28, further comprising: providing connection pins on said substrate.

31. The method of claim 28, further comprising: forming at least one angled portion in the heat dissipater.

* * * * *